United States Patent [19]
Harvell

[11] Patent Number: 5,831,558
[45] Date of Patent: Nov. 3, 1998

[54] METHOD OF COMPRESSING AND DECOMPRESSING DATA IN A COMPUTER SYSTEM BY ENCODING DATA USING A DATA DICTIONARY

[75] Inventor: Laco Scott Harvell, Merrimack, N.H.

[73] Assignee: Digital Equipment Corporation, Maynard, Mass.

[21] Appl. No.: 664,656

[22] Filed: Jun. 17, 1996

[51] Int. Cl.[6] .................................................. H03M 7/00
[52] U.S. Cl. .............................. 341/106; 341/50; 341/51
[58] Field of Search .................................. 341/106, 50, 51

[56] References Cited

U.S. PATENT DOCUMENTS

4,558,302  12/1985  Welch .
5,051,745   9/1991  Katz ........................................... 341/51

Primary Examiner—Brian K. Young
Assistant Examiner—Jason L.W. Kost
Attorney, Agent, or Firm—David A. Dagg

[57] ABSTRACT

A method of transmitting an encoded file from a first computer system to a second computer system. The method utilizes a data dictionary having a number of entries. Each of the data dictionary entries contains an entry character array, an entry compression array, and an entry counter. Data packets are read into the memory and are encoded into the encoded file by using the data dictionary. The encoded file is then transmitted from the first system to the second system. The method also contains a decoding function wherein encoded packets received by the second system are decoded using the data dictionary.

17 Claims, 7 Drawing Sheets

```
/* DATA DICTIONARY in C Programming Lang */

/* should be power of 2 */
#define CHAR_ARRAY_SIZE
        num_of_entries_in_the_character_array /* should be power of 2 */
define DICTIONARY_ARRAY_SIZE
        num_of_dictionary_entries struct DICT_ENTRY
    {
    unsigned char data_element_count;
    unsigned char
        character_array [CHAR_ARRAY_SIZE-1];
unsign char
        compress_array[CHAR-ARRAY_SIZE-1];
    } struct DICTIONARY
    {
    struct DICT_ENTRY
        DataDictionary[DICTIONARY_ARRAY_SIZE];
    }
```

```
/* Compression Pseudo Code */ define CHAR_MASK number of bits that reflects CHAR_ARRAY_SIZE compress (input_file, output_file, length)

hash = 0 while (length .not_equal. 0)
{
character = get_character_from_file (input_file)
compress_array_index =
    DataDictionary[hash].character_array(character & CHAR_MASK)
data_ele_count = DataDictionary[hash].data_element_count
if (compress_array_index .not_equal. 0xFF)
{
if
(Data_Dictionary[hash].Compress_array[compress_array_index]
.equal.character)
{
write_bits(output_file, compress_array_index,bit_count (data_ele_count=
DataDictionary[hash].data_element_count data_ele_count = DataDictionary }
end compress
```

*Figure 6*

```
define CHAR_MASK number_of_bits_that_reflects_CHAR_ARRAY-SIZE decompress(input_file, length)

hash = 0
length = length .times.8 /*this converts length to a bit count */ while (length .not_equal. 0)
{
data_ele_count = DataDictionary [hash]. data_element_count
compress_index = read_bits(input_file,
bit_count(data_element count))
length = length .times. 8 /* this converts length to a bit count */
while (length .not_equal. 0)
data_ele_count = DataDictionary[hash], data_element_count
compress_index = read_bits(input_file, bit_count(data_element_count))
length = length – bit_count(data_element_count)
if (compress_index .less_than. data_element_count)
{
character = DataDictonary[hash].compress_array[compress_index]
)
else
{
character = read_bits(output_file, 8)
length = length – 8
character_index = character & CHAR_MASK
if(DataDictionary[hash].character_array[character_index] .not_equal. 0xFF
{
real_compress_index = DataDictionary[hash].character_array[character_index]
DataDictionary[hash].compress_array[real_compress_index] = character
}
else
{
if (data_ele_count .equal. (CHAR_ARRAY_SIZE-1))
data_element_count = data_element_count – 1
else
DataDictionary[hash].data_element_count =
DataDictionary[hash].data_element_count +1
DataDictionary[hash].compress_array[data_element_count] = character
DataDictionary[hash].character_array[character & CHAR_MASK] =
Data_element_count
}
}
write_character_to_file(character)
hash = hash(character)
}
end decompress
```

*Figure 7*

METHOD OF COMPRESSING AND DECOMPRESSING DATA IN A COMPUTER SYSTEM BY ENCODING DATA USING A DATA DICTIONARY

FIELD OF THE INVENTION

The present invention relates to the field of information theory, and more particularly to the field of data compression and decompression of the compressed data.

BACKGROUND OF THE INVENTION

As is known, data compression techniques try to increase the efficiency of encoding information by reducing the number of bits used to represent the information. A data compression utility is usually run against a data file so that the resulting compressed file is smaller than the original, i.e., data compression refers to any process that converts data in a given format into an alternative format having fewer bits than the original. This is very useful for the storage of data or the transmission of data. For example, compression is useful for decreasing the amount of data being transmitted across a Wide Area Network (WAN). Data is compressed on one side of a WAN link and decompressed on the other side of the WAN link before it is sent on. The result of the compression is that there is less data to send across the WAN link, which, in effect, increases the bandwidth of the WAN link. Thus, when using compression, a lower speed WAN link may be used to transmit the same amount of data. Since WAN bandwidth is one of the most expensive parts of an inter-network, data compression may allow a network administrator to use lower speed links and thereby save money.

A compression method defines the specific technique used for compressing and decompressing data. As is known, compression methods may be classified by the technique used to compress the data. By way of example, some of the more common techniques are methods based on dictionaries, methods based on guess tables, and methods based on combinations of dictionaries and guess tables.

Regardless of the method, it is well known that the process of compressing and decompressing data is both CPU-intensive and memory-intensive. For example, when compressing data going across a WAN link, it is well known that one is trading excess router CPU capacity and memory resources at each end of the link for increased WAN bandwidth. Compression methods may be compared in terms of how CPU-intensive they are, how memory-intensive they are, and what compression ratio they achieve.

One approach to data compression, for example, has been to use a dictionary-based method. Dictionary-based methods create a dictionary, which contains the mappings of strings to their respective keys. The sending device removes the repeating strings within each packet and replaces them with the key string, and the receiving device reverses the process, restoring the original data and removing the key. Both the sending and receiving devices should have the same dictionary in order to replace the key with the original text at the receiving end.

One type of dictionary-based data compression uses a running dictionary. The mappings of strings to keys is maintained and reused across multiple packets being transmitted and received. As is known in the art, this method has the benefit of achieving high compression ratios. With such a method, running dictionaries typically require large amounts of memory be maintained. Generally, the larger the dictionary and the more memory used, the better the compression results, because it is more likely that a string will already have a key defined in the dictionary. However, if the dictionaries at the sending and receiving devices get out of synchronization, all data packets will be dropped until the dictionaries re-synchronize. Further, it is well known that the less reliable the link between the sending and receiving devices is, the more probable it is that the dictionaries will be out of synchronization. This may result in poor performance or complete failure of the connection. Running dictionaries also have difficulty with WAN technologies that use datagram oriented-protocols, in which data packets may arrive at the receiving device out of order or corrupted. In other words, running dictionaries require that packets be reliably delivered across the link with no data loss or corruption. Additionally, if the WAN link uses multiple virtual circuits (VCs), then a separate dictionary is used for each VC, thus requiring even more memory.

Another approach to this problem has been referred to as a packet-by-packet dictionary method. This method was designed to overcome the memory and link quality limitations of running dictionaries. With this method, a very small dictionary is used, and it is reset for each packet. Very little memory is required to store the dictionary, and there is no way for the sending and receiving devices to get out of synchronization, even when using unreliable WAN link protocols. However, it is well known that packet-by-packet dictionary methods do not achieve compression ratios as high as running dictionary methods because there is no chance of reusing a key from matching strings in previous packets. However, the higher ratios of running dictionary methods are diminished by the fact that reliable link protocols use more link bandwidth for acknowledgment (ACK) packets. Therefore, it is known that the overall throughput may not be as high as expected when using running dictionaries. Additionally, the synchronization problems associated with running dictionaries makes the overall performance of packet-by-packet methods more effective for use on wide area links.

Still another approach has been to use what is referred to as a guess-table-based compression method. This method tries to guess the contents of the next byte based on previous data strings and enters the guess into a guess table. If the guess is correct, that byte is not transmitted on the link. Both the sending and receiving devices must have the same guess table in order to insert the guess into uncompressed text at the receiving end.

What is needed is a compression method that is fast and produces respectable compression ratios.

SUMMARY OF THE INVENTION

In accordance with the present invention, a method of transmitting an encoded file from a first computer system to a second computer system including the steps of initializing a data dictionary in a memory of the first computer system, the data dictionary having a number of entries, each of the entries containing an entry character array having a number of elements, an entry compression array having a number of elements, and an entry counter, reading a file of a number of data packets in the memory of the first computer system, compressing the number of data packets into the encoded file by using the data dictionary, and transmitting the encoded file from the first computer system to the second computer system. With such a method a fast compression is obtained with optimal compression ratios.

A method embodying the present invention also includes reading a number of data packets in a memory of the computer system, initializing a data dictionary in the memory, compressing the number of data packets to form a first set of compressed data packets, and decompressing the first set of data packets.

BRIEF DESCRIPTION OF THE DRAWINGS

The novel features believed characteristic of the invention are set forth in the appended claims. The invention itself, however, as well as other features and advantages thereof, will be best understood by reference to the detailed description of the specific embodiments which follows, when read in conjunction with the accompany drawings, wherein:

DESCRIPTION OF THE PREFERRED EMBODIMENT(S)

The present invention comprises a method wherein bytes in a file are compressed with a minimum number of bits to clearly indentify the original byte. Generally, this method is performed using a unique data dictionary that can be constructed with reading the original file or the compressed output.

Data compression is useful for decreasing the amount of data being transmitted in a variety of computer applications. By way of example, the present invention shall be explained in the context of data transmission in an exemplary router in an exemplary wide area network (WAN).

Figure 1:
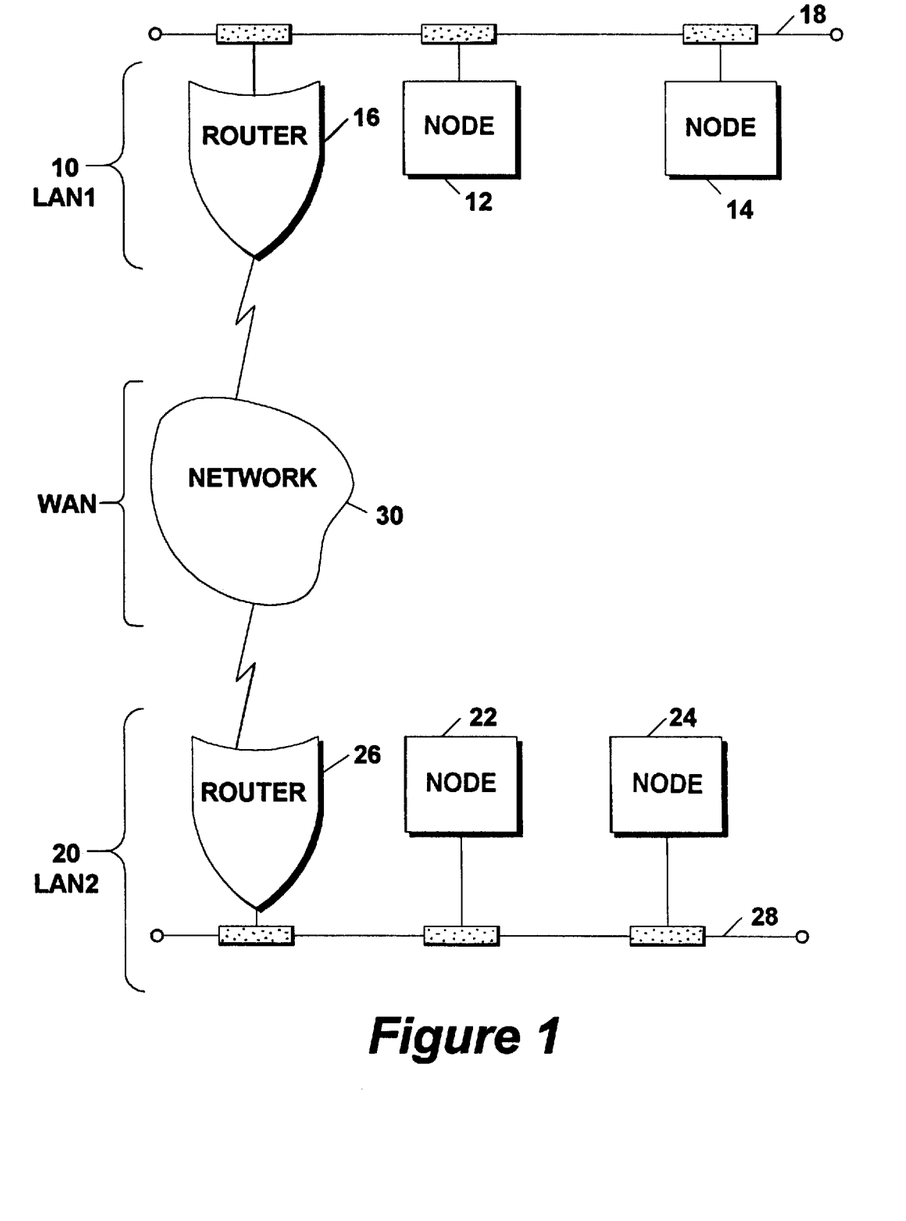
FIG. 1 is a block diagram of an exemplary wide area network (WAN) in which the present invention may be utilized.

Referring now to FIG. 1, an exemplary WAN is shown to include two exemplary local area networks (LANs), labeled 10 and 20, respectively. LAN 10 is further shown to include a node 12, a node 14, and a router 16 connected to an ethernet line 18. LAN 20 is shown to include a node 22, a node 24, and a router 26 connected to an ethernet line 28. LAN 10 and LAN 20 are shown to connected to each each by a network 30. Specifically, the router 16 of LAN 10 connects to the network 30, while the router 26 of LAN 20 connects to the network 30.

In an exemplary data transmission from LAN 10 to LAN 20, the node 12 sends packets of data to ethernet line 18 and on to the router 16. The router 16 sends the packets of data to network 30. The packets of data are received by the router 26, and then transmitted over ethernet line 28 to node 22.

Generally, a router is a computer device that can send and receive data packets, and route data packets from one computer system to another. In the exemplary WAN of FIG. 1, the present invention resides in the routers 16 and 26. Thus, each router 16 and 26 contains the present invention which provides a method of data compression and data decompression. Using the data transmission example discussed above, packets of data arrive at router 16. The present invention compresses the packets of data before they are sent on to the network 30. Router 26 receives the compressed data, and the present invention decompresses this compressed data before sending it on to the ethernet line 28. The compression of packets of data in router 16 results in less data being transmitted from router 16 to network 30, which, in effect, increases the bandwidth of router 16. For example, a router 16 which has a thoughput of 64 Kbits/s, using the present data compression method, may experience throughputs of up to 96 Kbits/s.

Figure 2:
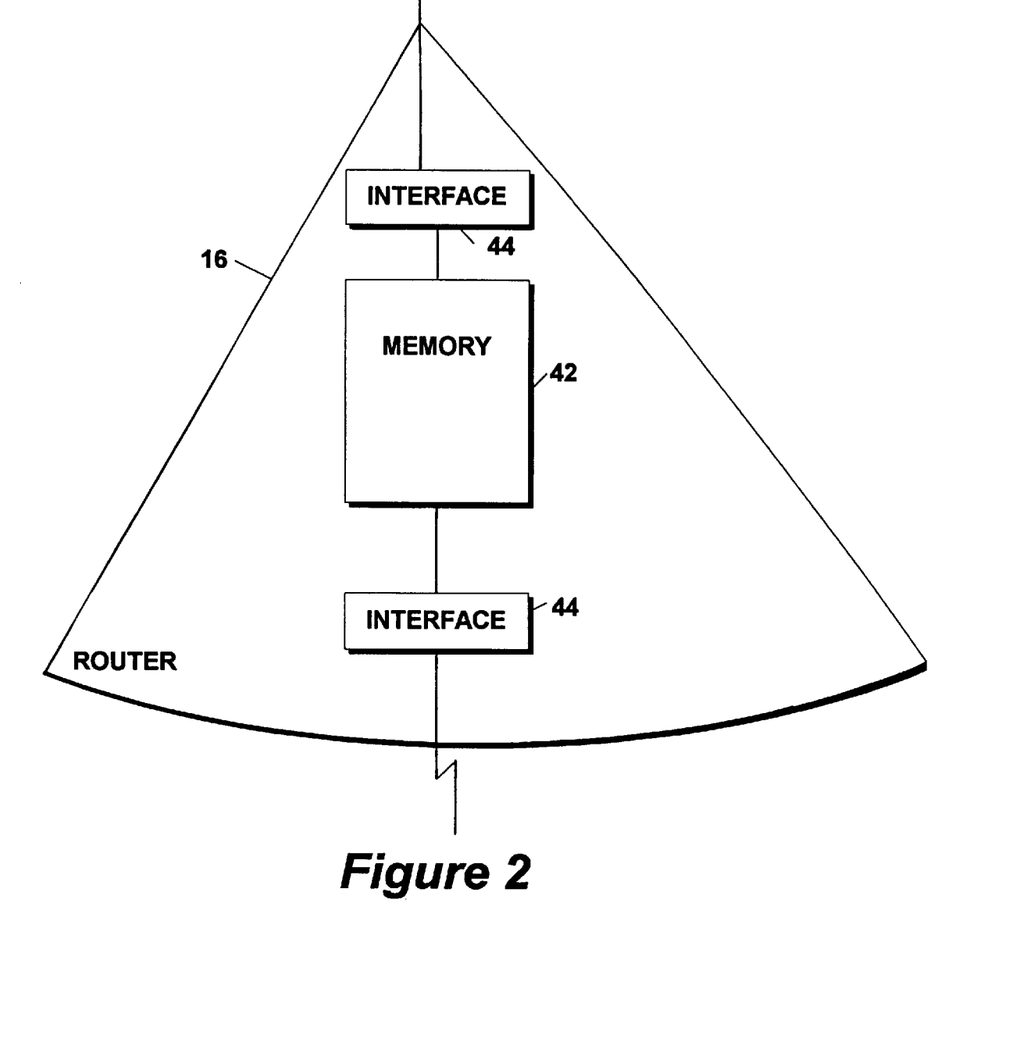
FIG. 2 is a block diagram of an exemplary router of the WAN shown in FIG. 1.

Referring to FIG. 2, the router 16 of FIG. 1 is shown to include an interface 40, a memory 42, and an interface 44. The interface 40 provides connection of the router 16 to network 30, while interface 44 provides connection of the router 16 to ethernet line 18. The present invention may be found to reside in the memory 42.

Figure 3:
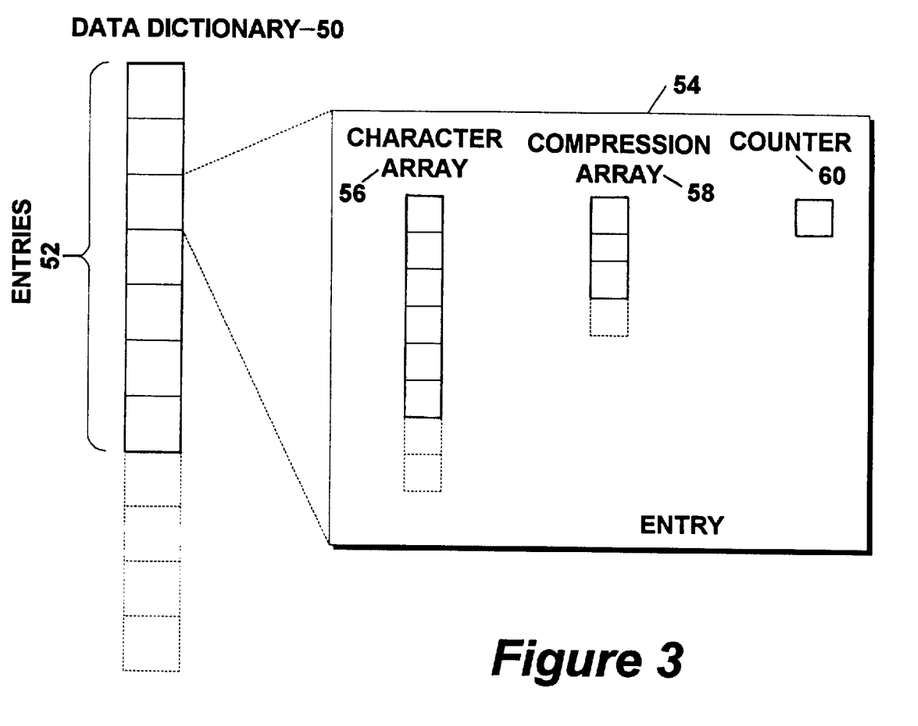
FIG. 3 is a block diagram showing a data dictionary in accordance with the principles of the present invention.

The present invention utilizes a data dictionary which is constructed with reading an original file of data packets. Referring to FIG. 3, the data dictionary 50 comprises a variable number of entries 52. Each of the entries 52 further includes a character array, a compression array, and a counter. For example, an exemplary entry 54 is shown to include a character array 56, a compression array 58, and a counter 60. The character array 56 contains a pointer to an entry in the compression array 58 or to a null pointer. The compression array 58 contains a pointer to a first entry in the character array 56 or a null pointer. The counter 60 is used to keep track of the number of active data elements in entry 54. It is preferred that all arrays be in powers of two.

Figure 4:
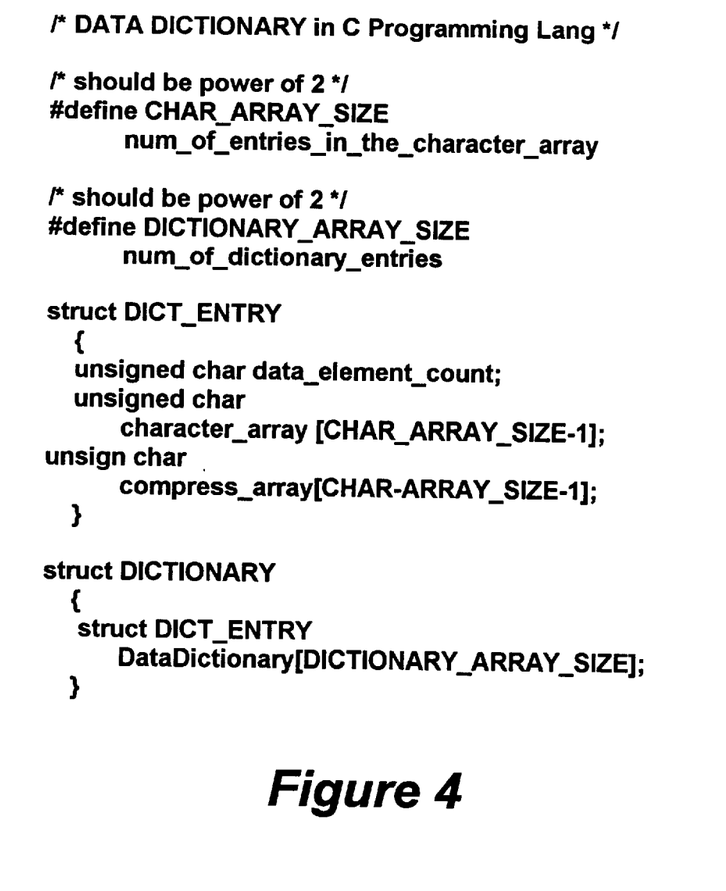
FIG. 4 is the C programming language code for constructing the data dictionary of FIG. 3.

The above description of the data dictionary may be described in the C programming language as shown in FIG. 4.

Using the data dictionary shown in FIGS. 3 and 4, data compression is accomplished in the following manner (fully described below). Data compression is achieved by first hashing some number of previous characters into a pointer to a data dictionary entry in the DataDictionary. Then a portion of the current character is used as an index to the character_array. If the character_array contains a valid pointer into the compress-array and the compress_array contains the same character that one is trying to compress, then the byte is replaced with the compress_array index. The data_element_count is used to determine the minimum number of bits to encode to represent the compress_array index. If the compress_array contains a single element, data_element_count=1, then the index can be represented with one bit. If the compress_array contains four elements, then the index will need three bits.

Figure 5:
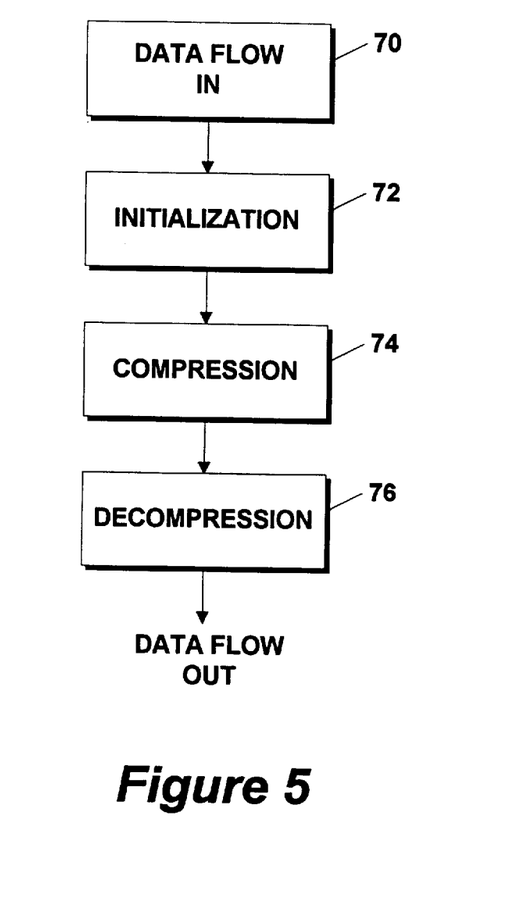
FIG. 5 is a flow graph of the steps utilitized in compressing and decompressing data in accordance with the principles of the present invention.

Referring now to FIG. 5, the present method will be described in detail. As shown in FIG. 5, packets of data 70 flow into, for example, router 16 of FIG. 1 wherein, at step 72, an initialization occurs. After the initialization, the packets of data 70 are compressed at step 74. Lastly, the compressed data is decompressed at step 76, wherein the packets of data in an uncompressed format flow out.

The initialization step at 72 of FIG. 5 begins by setting the elements of the DataDictionary to their default values. The data_element_count is set to zero, all elements of the compress_array are set equal to zero, and all elements of the character_array are set to hexadecimal OxFF. This initialization may be represented by the following pseudo code:

```
initialize_data_dictionary ()
    for (DICTIONARY_ARRAY_SIZE)
    data_element_count = 0
    character_array[0 ... CHAR_ARRAY_SIZE] = 0xFF
    compress_array[0 ... (CHAR_ARRAY_SIZE-1)] = 0
end initialize_data_dictionary
```

As mentioned above, at step 74, compression of the packets of data occurs. At step 74, an input file of packets of data is read byte by byte and each byte examined to see if it can be compressed. If a byte is not compressed, the byte is used to update the DataDictionary.

As each character (i.e., byte) is read in, a hash index constructed from previous bytes is used to select a single dictionary entry. The character to be compressed is then masked to produce an index into the character_array, the mask leaving only enough bits to represent the full character_array. If the selected entry in the character_array is not 0xFF, then it is an index into the compress_array and the character is compared with the entry in the compress_array pointed to by the character_array index. If they match, the index is written into the output file using only the number of bits that can represent the current_data_element_count plus one.

If the character in the compress array, pointed to by the character array index does not match the current character, then the data element count plus one is written to the output_file followed by the eight bits of the character itself. Then the new character is written into the compress_array at the character_array index. This allows one to favor the most recent information. Finally, if the selected entry in the compress_array is 0xFF, then the data_element_count plus one is written to the output_file followed by the eight bits of the character itself. Then the new character is placed into the compress_array at the next free entry in the compress_array and the index is written into the character_array. Then the data_element_count is incremented, if it has not reached the CHAR_ARRAY_SIZE minus one. If there are no free entries in the compress_array, then the last entry is overwritten and the index for that entry is written into the character_array, in this case the data_element_count is not incremented.

It should be noted that the method for encoding a character that will overwrite an existing entry in the compress_array or a new entry in compress_array is the same and that the character itself will allow the decompressor to determine which type it is.

Figure 6:
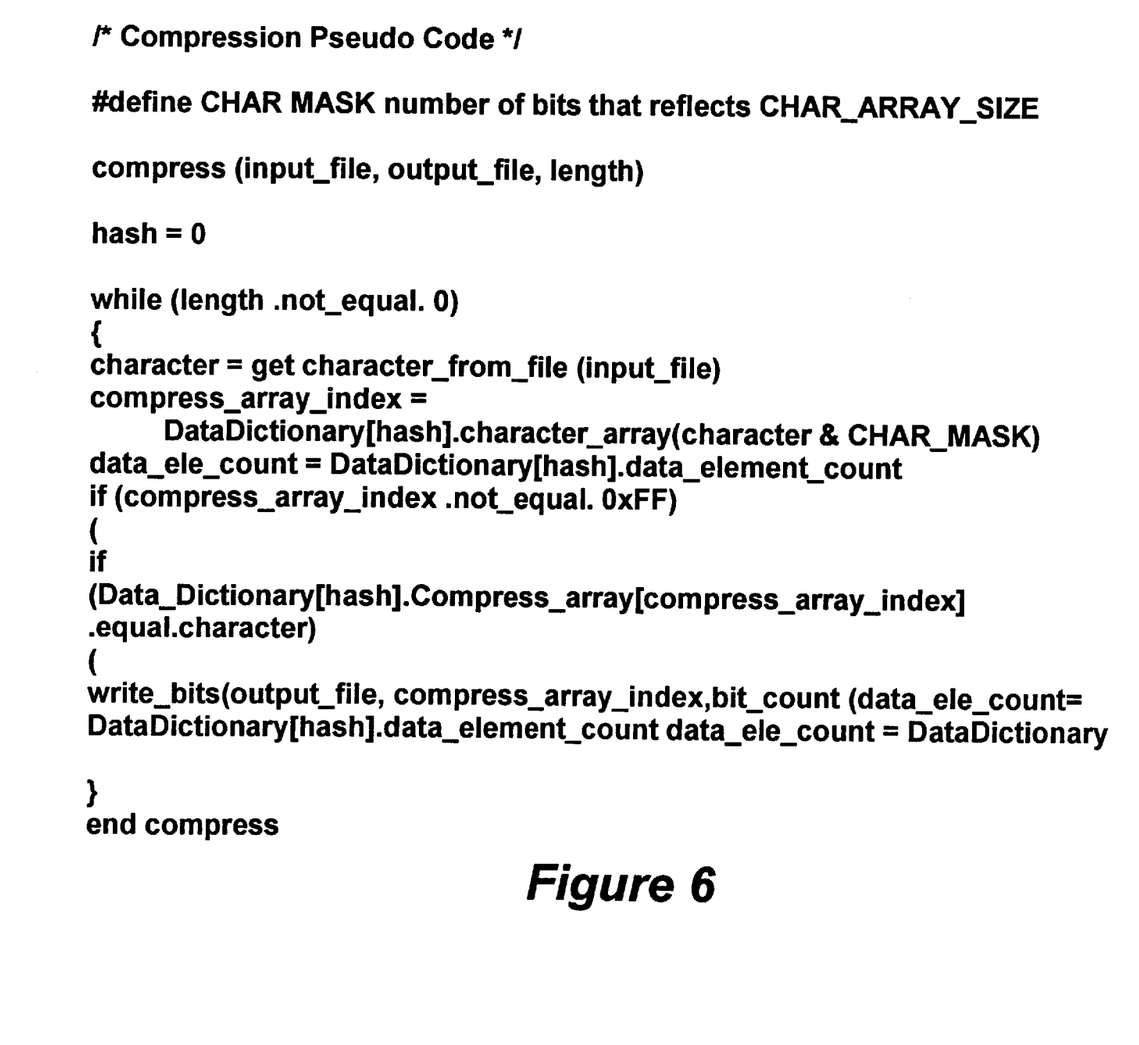
FIG. 6 is a pseudo code representation of the compression step of FIG. 5.

A pseudo code representation of the compression step 74 (of FIG. 5) is shown in detail in FIG. 6. In the pseudo code shown in FIG. 6, three routines are used: write_bits ( ) will write bits to an output_file given the output_file, value of bits to be written, and the number of bits to be written; read_bits ( ) will read bits from an input_file given the input_file, and number of bits to be read; bit_count ( ) will turn a decimal number into a count of the minimum number of bits needed to represent that number.

As mentioned with reference to FIG. 5, at step 76, decompression of the compressed packets of data occurs. At step 76, an input file is read bit by bit, and using the bits for an index into the DataDictionary, the original data is reconstructed. First, a hash of the previous characters selects a dictionary entry. From this entry we use the data_element_count to determine the number of bits that need to be read for this character from the input_file, then that number of bits is read from the file. If the bits read equal a number less then the data_element_count, then this is a compressed character and the number is used as an index into the compress_array at the character that is found and that index is written into the output_file.

If the bits read equal the data_element_count, then this is an uncompressed character and the next eight bits are the actual character. Then the next eight bits are read in and a mask is applied to the character to see which entry in the character_array this character would occupy. If the selected entry in the character_array does not contain 0xFF, then it contains an index into the compress_array and the new character is written into the compress_array at that index.

If the selected entry in the character_array does equal 0xFF, then this is a new entry and the new character is placed into the compress_array at the next free entry in the compress_array and the index is written into the character_array. Then the data_element_count is incremented, if it has not reached the CHAR_ARRAY_SIZE minus one. If there are no free entries in the compress_array then the last entry is overwriten and the index for that entry is written into the character_array; in this case the data_element_count is not incremented.

Figure 7:
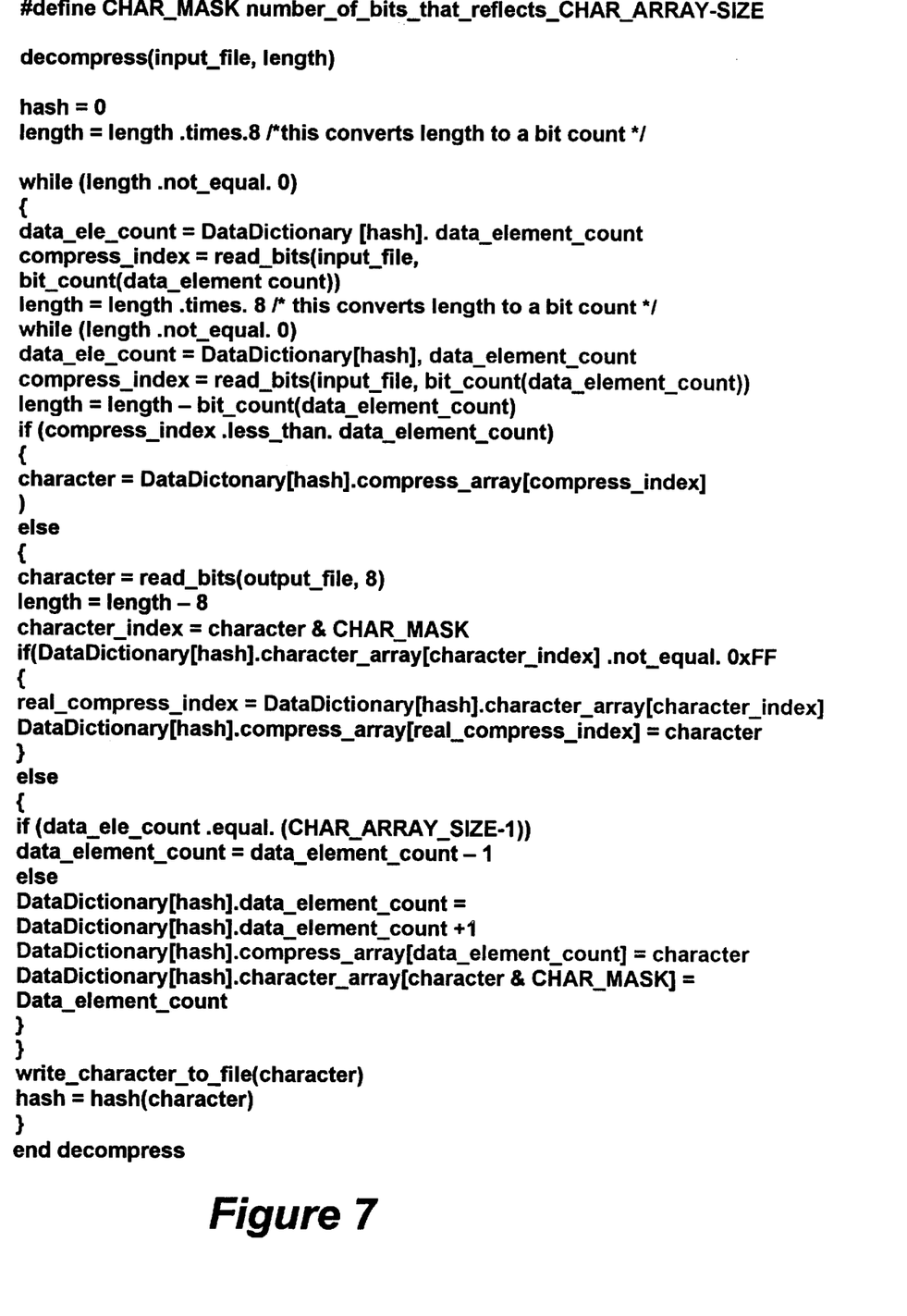
FIG. 7 is a pseudo code representation of the decompression step of FIG. 5.

The pseudo code for the decompression step is shown in FIG. 7. In FIG. 7, three routines are used. Write_bits( ) will write bits to an output_file given the output_file, a value of the bits to be written, and the number of bits to be written. Read_bits( ) will read bits from an input_file given an input_file, and the number of bits to be read. Lastly, bit_count( ) will turn a decimal number into a count of the minimum number of bits needed to represent that number.

Having described a preferred embodiment of the invention, it will now become apparent, to one of skill in the art that other embodiments incorporating its concepts may be used. It is felt therefore, that this embodiment should not be limited to the disclosed embodiment, but rather should be limited only by the spirit and scope of the appended claims.

What is claimed is:

1. A method of transmitting an encoded file from a first computer system to a second computer system comprising the steps of:

initializing a data dictionary in a memory of the first computer system, said data dictionary having a plurality of entries, each of the entries containing a character array having a plurality of elements, a compression array, and an entry counter;

reading a file of a plurality of data packets in the memory of the first computer system;

compressing the plurality of data packets into the encoded file by
   A. reading a first data packet of the plurality of data packets;
   B. hashing the first data packet to produce a hashed data packet;
   C. indexing into the character array using the hashed data packet as an index;
   D. determining if the indexed entry in the character array contains a pointer into the compression array;
   E. if a pointer into the compression array is found, then
      i. replacing the first data packet with the index into the character array;
      ii. determining a number of bits required to store the index;
      iii. storing the number of bits required in the entry counter;
   F. repeating steps A–E until there are no more data packets to read; and transmitting the encoded file from the first computer system to the second computer system.

2. The method of transmitting an encoded file from a first computer system to a second computer system according to claim 1 wherein the step of initializing the data dictionary comprises the step of initializing each of the plurality of entries, said step of initializing the entries further comprising the steps of:

setting each element of the entry character array to a selected hexadecimal value;

setting each element of the compression array to zero; and setting the entry counter to zero.

3. The method of transmitting an encoded file from a first computer system to a second computer system according to claim 1 wherein the step of compressing the plurality of data packets into the encoded file comprises the steps of:

reading a first data packet;

hashing said data packet to produce a hashed data packet;

using said hashed data packet as an index into the entry character array;

determining if the entry character array contains a valid index into the compression array and the same first data packet;

replacing the first data packet with the index into the entry character array in response to the step of determining;

determining a number of bits required to store the index;

storing the number of bits required to store the index in the entry counter; and repeating the above steps until there is no more data packets to read.

4. A method of receiving and decoding an encoded file in a second computer system from a first computer system comprising the steps of:

initializing a data dictionary in a memory of the second computer system, said data dictionary having a plurality of entries, each of said entries containing a character array having a plurality of elements, a compression array having a plurality of elements, and an entry counter;

receiving a plurality of encoded data packets in the memory of the second computer system from the first computer system, said packets received from a communications link connecting the first computer system to the second computer system; and decoding the plurality of encoded data packets into an unencoded file by
A. reading the encoded file bit by bit; and,
B. indexing into the data dictionary by using each of the bits as an index.

5. The method of receiving and decoding an encoded file in a second computer system from a first computer system according to claim 4 wherein the step of initializing the data dictionary comprises the step of initializing each of the plurality of entries, said step of initializing the entries further comprising the steps of:

setting each element of the character array to a selected hexadecimal value;

setting each element of the compression array to zero; and setting the entry counter to zero.

6. The method of receiving and translating an encoded file in a second computer system from a first computer system according to claim 4 wherein the step of decoding comprises the steps of:

reading the encoded file bit by bit; and using each of the bits as an index into the data dictionary.

7. The method of receiving and translating an encoded file according to claim 4 wherein the step of indexing further comprises the steps of:

using a hash of a previous character to select a data dictionary entry;

using a data element count of the data dictionary entry to determine a number of bits that need to be read for the character;

reading the determined number of bits from the encoded file;

determining whether the value represented by the read bits is less than the data element count; and using the data element count in response to the step of determining.

8. A method of compressing and decompressing a plurality of data packets in a computer system comprising the steps of:

reading said plurality of data packets in a memory of the computer system;

initializing a data dictionary in said memory, said data dictionary having a plurality of entries, each of said entries containing a character array having a plurality of elements, a compression array having a plurality of elements, and an entry counter;

compressing the plurality of data packets to form a first set of compressed data packets by
A. reading a first data packet of said plurality of data packets;
B. hashing said first data packet to produce a hashed data packet;
C. indexing into the character array using said hashed data Packet as an index;
D. determining if the indexed entry in the character array contains a pointer into the compression array;
E. if a pointer into the compression array is found, then
 i. replacing the first data packet with the index into the character array;
 ii. determining a number of bits required to store the index;
 iii. storing the number of bits required in the entry counter;
F. repeating steps A–E until there are no more data packets to read; and decompressing said first set of data packets.

9. The method of compressing and decompressing a plurality of data packets in a computer system according to claim 8 wherein the step of initializing the data dictionary comprises the steps of:

setting each element of the entry character array to a selected hexadecimal value;

setting each element of the entry compression array to zero; and setting the entry counter to zero.

10. The method of compressing and decompressing a plurality of data packets in a computer system according to claim 8 wherein the step of compressing the plurality of data packets into the first set comprises the steps of:

reading a first data packet;

hashing said data packet to produce a hashed data packet;

using said hashed data packet as an index into the entry character array;

determining if the entry character array contains a valid index into the compression array and the same first data packet;

replacing the first data packet with the index into the entry character array in response to the step of determining;

determining a number of bits required to store the index;

storing the number of bits required to store the index in the entry counter; and repeating the above steps until there is no more data packets to read.

11. The method of compressing and decompressing a plurality of data packets in a computer system according to claim 8 wherein the step of decompressing comprises the steps of:

reading the encoded file bit by bit;

using each of the bits as an index into the data dictionary, the step of using further comprising the steps of:

using a hash of a previous character to select a data dictionary entry;

using a data element count of the data dictionary entry to determine a number of bits that need to be read for the character;

reading the determined number of bits;

determining whether the value represented by the read bits is less than the data element count; and using the data element count in response to the step of determining.

12. A method of encoding a plurality of data packets in a computer system comprising the steps of:

A. providing a memory;

B. initializing a data dictionary in the memory, said data dictionary having a plurality of entries, each of said entries containing a character array having a plurality of elements, a compression array having a plurality of elements, and an entry counter;

C. reading the plurality of data packets in the memory;

D. reading a first data packet of said plurality of data packets;

E. hashing said first data packet to produce a hashed data packet;

F. indexing into the character array using said hashed data packet as an index;

G. determining if the indexed entry in the character array contains a pointer into the compression array;

H. if a pointer into the compression array is found, then
 i. replacing the first data packet with the index into the character array;
 ii. determining a number of bits required to store the index;
 iii. storing the number of bits required in the entry counter;

I. repeating steps D–H until there are no more data packets to read thereby compressing the plurality of data packets into an encoded file; and storing the encoded file in the memory.

13. The method of encoding a plurality of data packets in a computer system according to claim 12 wherein the step of initializing the data dictionary comprises the steps of:

setting each element of the character array to a selected hexadecimal value;

setting each element of the entry compression array to zero; and setting the entry counter to zero.

14. The method of encoding a plurality of data packets in a computer system according to claim 12 wherein the step of compressing the plurality of data packets into the encoded file comprises the steps of:

reading a first data packet;

hashing said data packet to produce a hashed data packet;

using said hashed data packet as an index into the entry character array;

determining if the entry character array contains a valid index into the compression array and the same first data packet;

replacing the first data packet with the index into the entry character array in response to the step of determining;

determining a number of bits required to store the index;

storing the number of bits required to store the index in the entry counter; and repeating the above steps until there is no more data packets to read.

15. A method of decoding an encoded data file in a computer system comprising the steps of:

providing a memory;

initializing a data dictionary in the memory, said data dictionary having a plurality of entries, each of said entries containing a character array having a plurality of elements, a compression array having a plurality of elements, and an entry counter;

reading the encoded data file in the memory;

decoding the encoded data file using the data dictionary to produce a plurality of data packets; and storing the plurality of data packets in the memory.

16. The method of decoding an encoded data file in a computer system according to claim 15 wherein the step of initializing the data dictionary comprises the steps of:

setting each element of the character array to a selected hexadecimal value;

setting each element of the compression array to zero; and setting the entry counter to zero.

17. The method of decoding an encoded data file in a computer system according to claim 15 wherein the step of decoding comprises the steps of:

reading the encoded file bit by bit;

using each of the bits as an index into the data dictionary, the step of using further comprising the steps of:

using a hash of a previous character to select a data dictionary entry;

using a data element count of the data dictionary entry to determine a number of bits that need to be read for the character;

reading the determined number of bits;

determining whether the value represented by the read bits is less than the data element count; and using the data element count in response to the step of determining.

* * * * *